United States Patent
Hwang et al.

(10) Patent No.: US 10,163,837 B2
(45) Date of Patent: Dec. 25, 2018

(54) CU PILLAR BUMP WITH L-SHAPED NON-METAL SIDEWALL PROTECTION STRUCTURE

(71) Applicant: TAIWAN SEMICONDUCTOR MANUFACTURING COMPANY, LTD., Hsinchu (TW)

(72) Inventors: Chien Ling Hwang, Hsinchu (TW); Yi-Wen Wu, Xizhi (TW); Chung-Shi Liu, Shinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 2 days.

(21) Appl. No.: 15/368,936

(22) Filed: Dec. 5, 2016

(65) Prior Publication Data
US 2017/0084563 A1    Mar. 23, 2017

Related U.S. Application Data

(62) Division of application No. 12/781,987, filed on May 18, 2010, now Pat. No. 9,524,945.

(51) Int. Cl.
*H01L 23/00* (2006.01)

(52) U.S. Cl.
CPC .............. *H01L 24/13* (2013.01); *H01L 24/11* (2013.01); *H01L 24/05* (2013.01); *H01L 24/16* (2013.01);
(Continued)

(58) Field of Classification Search
CPC ...................... H01L 24/13; H01L 24/11; H01L 2224/11019; H01L 2924/07025;
(Continued)

(56) References Cited

U.S. PATENT DOCUMENTS

| 3,528,090 A | 9/1970 | Van Laer |
| 4,380,867 A | 4/1983 | Antson |

(Continued)

FOREIGN PATENT DOCUMENTS

| CN | 200965875 | 10/2007 |
| CN | 101436559 | 5/2009 |

(Continued)

OTHER PUBLICATIONS

Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.

(Continued)

*Primary Examiner* — David Vu
(74) *Attorney, Agent, or Firm* — Hauptman Ham, LLP

(57) ABSTRACT

A method of forming an integrated circuit device includes forming a bump structure on a substrate, wherein the bump structure has a top surface and a sidewall surface, and the substrate has a surface region exposed by the bump structure. The method further includes depositing a non-metal protection layer on the top surface and the sidewall surface of the bump structure and the surface region of the substrate. The method further includes removing the non-metal protection layer from the top surface of the bump structure, wherein a remaining portion of the non-metal protection layer forms an L-shaped protection structure, and a top surface of the remaining portion of the non-metal protection layer is farther from the substrate than a top surface of the bump structure.

20 Claims, 13 Drawing Sheets

(52) U.S. Cl.
CPC ...... *H01L 24/81* (2013.01); *H01L 2224/0345* (2013.01); *H01L 2224/0401* (2013.01); *H01L 2224/05611* (2013.01); *H01L 2224/05639* (2013.01); *H01L 2224/05644* (2013.01); *H01L 2224/05647* (2013.01); *H01L 2224/05671* (2013.01); *H01L 2224/10126* (2013.01); *H01L 2224/10145* (2013.01); *H01L 2224/11019* (2013.01); *H01L 2224/1145* (2013.01); *H01L 2224/11452* (2013.01); *H01L 2224/11462* (2013.01); *H01L 2224/11464* (2013.01); *H01L 2224/11622* (2013.01); *H01L 2224/11849* (2013.01); *H01L 2224/1308* (2013.01); *H01L 2224/1357* (2013.01); *H01L 2224/1369* (2013.01); *H01L 2224/13083* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13181* (2013.01); *H01L 2224/13552* (2013.01); *H01L 2224/13565* (2013.01); *H01L 2224/13575* (2013.01); *H01L 2224/13686* (2013.01); *H01L 2224/16145* (2013.01); *H01L 2224/16225* (2013.01); *H01L 2224/16227* (2013.01); *H01L 2224/814* (2013.01); *H01L 2224/81193* (2013.01); *H01L 2224/81447* (2013.01); *H01L 2224/81815* (2013.01); *H01L 2924/0103* (2013.01); *H01L 2924/0104* (2013.01); *H01L 2924/014* (2013.01); *H01L 2924/01006* (2013.01); *H01L 2924/01012* (2013.01); *H01L 2924/01013* (2013.01); *H01L 2924/01019* (2013.01); *H01L 2924/01023* (2013.01); *H01L 2924/01024* (2013.01); *H01L 2924/01025* (2013.01); *H01L 2924/01029* (2013.01); *H01L 2924/01032* (2013.01); *H01L 2924/01033* (2013.01); *H01L 2924/01038* (2013.01); *H01L 2924/01047* (2013.01); *H01L 2924/01049* (2013.01); *H01L 2924/01073* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/0504* (2013.01); *H01L 2924/07025* (2013.01); *H01L 2924/1305* (2013.01); *H01L 2924/1306* (2013.01); *H01L 2924/13091* (2013.01); *H01L 2924/14* (2013.01); *H01L 2924/1421* (2013.01); *H01L 2924/1431* (2013.01); *H01L 2924/1437* (2013.01)

(58) Field of Classification Search
CPC . H01L 2224/10145; H01L 2224/10126; H01L 2924/014; H01L 2924/01322; H01L 2924/01029; H01L 2224/81815; H01L 24/05; H01L 2224/81193; H01L 2224/16227; H01L 2224/13575; H01L 2224/13111; H01L 2224/13083; H01L 2224/1308; H01L 2224/11849; H01L 2224/11622; H01L 2224/11464; H01L 2224/11462; H01L 2224/1145; H01L 2224/0401; H01L 2224/0345; H01L 24/81; H01L 24/16; H01L 2224/1357; H01L 2224/13565; H01L 2224/13552; H01L 2224/13181; H01L 2224/13166; H01L 2224/13164; H01L 2224/13155; H01L 2224/13147; H01L 2224/13144; H01L 2224/13139
See application file for complete search history.

(56) References Cited

U.S. PATENT DOCUMENTS

| | | |
|---|---|---|
| 4,720,740 A | 1/1988 | Clements et al. |
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,134,460 A | 7/1992 | Brady et al. |
| 5,380,681 A | 1/1995 | Hsu |
| 5,391,917 A | 2/1995 | Gilmour et al. |
| 5,448,114 A | 9/1995 | Kondoh et al. |
| 5,466,635 A | 11/1995 | Lynch et al. |
| 5,481,133 A | 1/1996 | Hsu |
| 5,510,298 A | 4/1996 | Redwine |
| 5,747,881 A | 5/1998 | Hosomi et al. |
| 5,767,001 A | 6/1998 | Bertagnolli |
| 5,998,292 A | 12/1999 | Black et al. |
| 6,002,177 A | 12/1999 | Gaynes et al. |
| 6,184,060 B1 | 2/2001 | Siniaguine |
| 6,187,678 B1 | 2/2001 | Gaynes et al. |
| 6,191,493 B1 | 2/2001 | Yasunaga et al. |
| 6,218,281 B1 | 4/2001 | Watanabe et al. |
| 6,229,216 B1 | 5/2001 | Ma et al. |
| 6,229,220 B1 | 5/2001 | Saitoh et al. |
| 6,232,563 B1 | 5/2001 | Kim et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,322,903 B1 | 11/2001 | Siniaguine et al. |
| 6,355,501 B1 | 3/2002 | Fung et al. |
| 6,426,556 B1 | 7/2002 | Lin |
| 6,434,016 B2 | 8/2002 | Zeng et al. |
| 6,448,168 B1 | 9/2002 | Rao et al. |
| 6,448,661 B1 | 9/2002 | Kim et al. |
| 6,464,895 B2 | 10/2002 | Forat et al. |
| 6,465,892 B1 | 10/2002 | Suga |
| 6,472,293 B1 | 10/2002 | Suga |
| 6,489,229 B1 | 12/2002 | Sheridan et al. |
| 6,492,198 B2 | 12/2002 | Hwang |
| 6,538,333 B2 | 3/2003 | Kong |
| 6,562,653 B1 | 5/2003 | Ma et al. |
| 6,570,248 B1 | 5/2003 | Ahn et al. |
| 6,576,381 B1 | 6/2003 | Hirano et al. |
| 6,578,754 B1 | 6/2003 | Tung |
| 6,590,295 B1 | 7/2003 | Liao et al. |
| 6,592,019 B2 | 7/2003 | Tung |
| 6,599,778 B2 | 7/2003 | Pogge et al. |
| 6,600,222 B1 | 7/2003 | Levardo |
| 6,607,938 B2 | 8/2003 | Kwon et al. |
| 6,639,303 B2 | 10/2003 | Siniaguine |
| 6,661,085 B2 | 12/2003 | Kellar et al. |
| 6,664,129 B2 | 12/2003 | Siniaguine |
| 6,693,361 B1 | 2/2004 | Siniaguine et al. |
| 6,731,003 B2 | 5/2004 | Joshi et al. |
| 6,740,582 B2 | 5/2004 | Siniaguine |
| 6,762,076 B2 | 7/2004 | Kim et al. |
| 6,770,958 B2 | 8/2004 | Wang et al. |
| 6,790,748 B2 | 9/2004 | Kim et al. |
| 6,800,930 B2 | 10/2004 | Jackson et al. |
| 6,818,545 B2 | 11/2004 | Lee et al. |
| 6,828,677 B2 | 12/2004 | Yap et al. |
| 6,841,883 B1 | 1/2005 | Farnworth et al. |
| 6,853,076 B2 | 2/2005 | Datta et al. |
| 6,869,831 B2 | 3/2005 | Cowens et al. |
| 6,879,041 B2 | 4/2005 | Yamamoto et al. |
| 6,882,030 B2 | 4/2005 | Siniaguine |
| 6,887,769 B2 | 5/2005 | Kellar et al. |
| 6,908,565 B2 | 6/2005 | Kim et al. |
| 6,908,785 B2 | 6/2005 | Kim |
| 6,917,119 B2 | 7/2005 | Lee et al. |
| 6,924,551 B2 | 8/2005 | Rumer et al. |
| 6,943,067 B2 | 9/2005 | Greenlaw |
| 6,946,384 B2 | 9/2005 | Kloster et al. |

(56) References Cited

U.S. PATENT DOCUMENTS

| | | | |
|---|---|---|---|
| 6,958,539 B2 | 10/2005 | Lay et al. |
| 6,962,867 B2 | 11/2005 | Jackson et al. |
| 6,962,872 B2 | 11/2005 | Chudzik et al. |
| 6,975,016 B2 | 12/2005 | Kellar et al. |
| 7,008,867 B2 | 3/2006 | Lei |
| 7,012,333 B2 | 3/2006 | Shimoyama et al. |
| 7,030,481 B2 | 4/2006 | Chudzik et al. |
| 7,037,804 B2 | 5/2006 | Kellar et al. |
| 7,049,170 B2 | 5/2006 | Savastiouk et al. |
| 7,056,807 B2 | 6/2006 | Kellar et al. |
| 7,060,601 B2 | 6/2006 | Savastiouk et al. |
| 7,064,436 B2 | 6/2006 | Ishiguri et al. |
| 7,071,546 B2 | 7/2006 | Fey et al. |
| 7,087,538 B2 | 8/2006 | Staines et al. |
| 7,111,149 B2 | 9/2006 | Eilert |
| 7,122,912 B2 | 10/2006 | Matsui |
| 7,151,009 B2 | 12/2006 | Kim et al. |
| 7,157,787 B2 | 1/2007 | Kim et al. |
| 7,193,308 B2 | 3/2007 | Matsui |
| 7,215,033 B2 | 5/2007 | Lee et al. |
| 7,262,495 B2 | 8/2007 | Chen et al. |
| 7,271,497 B2 | 9/2007 | Joshi et al. |
| 7,276,799 B2 | 10/2007 | Lee et al. |
| 7,279,795 B2 | 10/2007 | Periaman et al. |
| 7,297,574 B2 | 11/2007 | Thomas et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,335,972 B2 | 2/2008 | Chanchani |
| 7,345,350 B2 | 3/2008 | Sinha |
| 7,348,210 B2 | 3/2008 | Daubenspeck et al. |
| 7,355,273 B2 | 4/2008 | Jackson et al. |
| 7,391,112 B2 | 6/2008 | Li et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,462,942 B2 | 12/2008 | Tan et al. |
| 7,494,845 B2 | 2/2009 | Hwang et al. |
| 7,501,311 B2 | 3/2009 | Tsai |
| 7,524,755 B2 | 4/2009 | Widodo et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,566,650 B2 | 7/2009 | Lin et al. |
| 7,576,435 B2 | 8/2009 | Chao |
| 7,592,246 B2 | 9/2009 | Akram |
| 7,648,899 B1 | 1/2010 | Banerji et al. |
| 7,825,511 B2 | 11/2010 | Daubenspeck et al. |
| 7,834,450 B2 | 11/2010 | Kang |
| 7,928,534 B2 | 4/2011 | Hsu et al. |
| 2001/0000321 A1 | 4/2001 | Takeda et al. |
| 2002/0014705 A1 | 2/2002 | Ishio et al. |
| 2002/0033531 A1 | 3/2002 | Matsushima et al. |
| 2003/0156969 A1 | 8/2003 | Choi et al. |
| 2003/0216025 A1 | 11/2003 | Lu et al. |
| 2004/0094842 A1 | 5/2004 | Jimarez et al. |
| 2004/0166661 A1 | 8/2004 | Lei |
| 2005/0001324 A1 | 1/2005 | Dunn et al. |
| 2005/0026413 A1 | 2/2005 | Lee et al. |
| 2005/0077624 A1 | 4/2005 | Tan et al. |
| 2005/0179131 A1 | 8/2005 | Homma |
| 2005/0275098 A1 | 12/2005 | Wu |
| 2006/0017160 A1 | 1/2006 | Huang |
| 2006/0043603 A1 | 3/2006 | Ranade et al. |
| 2006/0166402 A1 | 7/2006 | Lim et al. |
| 2006/0237842 A1 | 10/2006 | Shindo |
| 2006/0278982 A1 | 12/2006 | Solo De Zaldivar |
| 2007/0023904 A1 | 2/2007 | Salmon |
| 2007/0080451 A1 | 4/2007 | Suh |
| 2007/0102815 A1 | 5/2007 | Kaufmann |
| 2007/0108606 A1 | 5/2007 | Watanabe |
| 2007/0231957 A1 | 10/2007 | Mitsuhashi |
| 2007/0284684 A1 | 12/2007 | Naito et al. |
| 2007/0287279 A1 | 12/2007 | Daubenspeck et al. |
| 2008/0246102 A1* | 10/2008 | Yoshida ............ H01L 21/28097 257/412 |
| 2008/0296764 A1 | 12/2008 | Chang et al. |
| 2009/0011543 A1 | 1/2009 | Karta et al. |
| 2009/0026608 A1 | 1/2009 | Tsai et al. |
| 2009/0045511 A1 | 2/2009 | Meyer et al. |
| 2009/0096109 A1 | 4/2009 | Iwasaki |
| 2009/0098724 A1 | 4/2009 | Yu |
| 2009/0130840 A1 | 5/2009 | Wang et al. |
| 2009/0166857 A1 | 7/2009 | Lee |
| 2009/0197114 A1 | 8/2009 | Shih et al. |
| 2009/0229857 A1 | 9/2009 | Fredenberg et al. |
| 2010/0052162 A1 | 3/2010 | Iijima |
| 2010/0090318 A1 | 4/2010 | Hsu et al. |
| 2010/0109159 A1 | 5/2010 | Ho et al. |
| 2010/0230810 A1 | 9/2010 | Kang et al. |
| 2011/0101523 A1 | 5/2011 | Hwang et al. |
| 2011/0101526 A1 | 5/2011 | Hsiao et al. |
| 2011/0156256 A1 | 6/2011 | Kang et al. |
| 2011/0163441 A1 | 7/2011 | Bachman |
| 2011/0195223 A1 | 8/2011 | Bchir |
| 2011/0215458 A1 | 9/2011 | Camacho et al. |
| 2011/0227216 A1 | 9/2011 | Tseng et al. |
| 2011/0281432 A1 | 11/2011 | Farooq et al. |

FOREIGN PATENT DOCUMENTS

| | | |
|---|---|---|
| JP | 5-267303 | 10/1993 |
| JP | 05-335313 | 12/1993 |
| JP | 2000-228420 | 8/2000 |
| JP | 2004-296497 | 10/2004 |
| JP | 2009-152423 | 7/2009 |
| TW | 200924090 | 6/2009 |

OTHER PUBLICATIONS

Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.

Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.

Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

U.S. Appl. No. 61/258,414, filed Nov. 5, 2009, Chien Ling Hwang, et al.

U.S. Appl. No. 61/238,749, filed Sep. 1, 2009, Chung-Shi Liu.

U.S. Appl. No. 61/258,393, filed Nov. 5, 2009, Chien Ling Hwang, et al.

U.S. Appl. No. 61/230,012, filed Jul. 30, 2009, Chung-Shi Liu, et al.

Office Action dated Apr. 26, 2016 from corresponding No. TW 099135514.

Office Action dated Sep. 1, 2016 from corresponding No. TW 099135514.

Office Action dated Apr. 23, 2014 from corresponding application No. CN 201010529468.1.

Office Action dated Mar. 28, 2018 from corresponding application No. CN 201610674177.9.

* cited by examiner

CU PILLAR BUMP WITH L-SHAPED NON-METAL SIDEWALL PROTECTION STRUCTURE

PRIORITY CLAIM

The present application is divisional of U.S. application Ser. No. 12/781,987, filed May 18, 2010, which is incorporated herein by reference in its entirety.

RELATED APPLICATION

U.S. application Ser. No. 12/781,987, is related to U.S. application Ser. No. 12/730,411 filed Mar. 24, 2010, now U.S. Pat. No. 8,841,766, issued Sep. 23, 2014, which is incorporated herein by reference in its entirety.

TECHNICAL FIELD

The present disclosure relates to integrated circuit fabrication, and more particularly, to bump structures in an integrated circuit device.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in this order on the I/O pad. The bumps themselves, based on the material used, are classified as solder bumps, gold bumps, copper pillar bumps and bumps with mixed metals. Recently, copper pillar bump technology is proposed. Instead of using solder bump, the electronic component is connected to a substrate by means of copper pillar bump, which achieves finer pitch with minimum probability of bump bridging, reduces the capacitance load for the circuits and allows the electronic component to perform at higher frequencies.

Cu pillar bump flip-chip assembly has the following advantages: (1) better thermal/electric performance, (2) higher current carrying capacity, (3) better resistance to electromigration, thus longer bump life, (4) minimizing molding voids—more consistence gaps between Cu pillar bumps. Also, lower cost substrate is possible by using Cu-pillar controlled solder spreading, eliminating lead-free teardrop design. However, copper has a tendency to be oxidized during the manufacturing process. Oxidized copper pillars may lead to poor adhesion of an electronic component to a substrate. The poor adhesion may cause serious reliability concerns due to high leakage currents. Oxidized copper pillars may also lead to underfill cracking along the interface of the underfill and the copper pillars. The cracks may propagate to the underlying low-K dielectric layers or to the solder used to bond the copper pillars to the substrate. A sidewall protection layer is therefore needed to prevent copper oxidation, but the conventional method of processing the Cu pillar sidewall suffers from high process costs and interface delamination issues. Currently, an immersion tin (Sn) process is employed to provide a tin layer on the Cu pillar sidewalls, but there are still concerns regarding process costs, adhesion between Sn and underfill, and issues of solder wetting onto sidewalls, which is a challenge for fine pitch package technology in new generation.

DETAILED DESCRIPTION OF ILLUSTRATIVE EMBODIMENTS

Figure 1A:
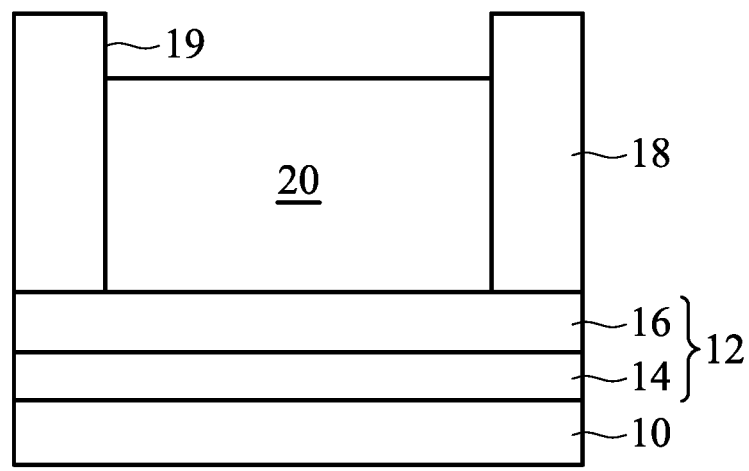
FIGS. 1A~1F are cross-sectional views depicting an exemplary embodiment of a portion of a semiconductor device at stages in a Cu pillar bump process.

This disclosure provides embodiments of sidewall protection processes for Cu pillar bump technology, in which an L-shaped protection structure on the sidewalls of the Cu pillar bump is formed of at least one of non-metal material layers, for example a dielectric material layer, a polymer material layer or combinations thereof. As employed throughout this disclosure, the term "Cu pillar bump" refers to a bump structure comprising a conductive pillar (a post or a standoff) formed of copper or copper alloys. The Cu pillar bump may be applied directly on an electrical pad or a redistribution layer on a semiconductor chip for a flip chip assembly or other similar application.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, FIGS. 1A~1F are cross-sectional views depicting an exemplary embodiment of a portion of a semiconductor device at stages in a Cu pillar bump process.

With reference to FIG. 1A, an example of a semiconductor substrate 10 used for bump fabrication is employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers. A pad region (not shown) is a top metallization layer formed in a top-level inter-layer dielectric layer, which is a portion of conductive routs and has an exposed surface treated by a planarization process, such as chemical mechanical polishing (CMP), if necessary. Suitable materials for the pad region may include, but are not limited to, for example copper (Cu), aluminum (Al), AlCu, copper alloy, or other mobile conductive materials. The pad region is used in the bonding process to connect the integrated circuits in the respective chip to external features.

The substrate 10 further includes a passivation layer (not shown) formed overlying and exposing a portion of the pad region for allowing subsequent Cu pillar bump processes. The passivation layer is formed of a non-organic material selected from un-doped silicate glass (USG), silicon nitride, silicon oxynitride, silicon oxide, and combinations thereof. Alternatively, the passivation layer is formed of a polymer layer, such as an epoxy, polyimide, benzocyclobutene (BCB), polybenzoxazole (PBO), and the like, although other relatively soft, often organic, dielectric materials can also be used.

Referring to FIG. 1A, the formation of an under-bump-metallurgy (UBM) layer 12 including a first UBM layer 14 and a second UBM layer 16 is performed on the substrate 10. For example, the UBM layer 12 is formed on the exposed portion of the pad region, and extends to a portion of the passivation layer. The first UBM layer 14, also referred to as a diffusion barrier layer or a glue layer, is formed of titanium, tantalum, titanium nitride, tantalum nitride, or the like by physical vapor deposition (PVD) or sputtering. The first UBM layer 14 is deposited to a thickness of between about 500 and 2000 angstrom, for example, to a thickness of about 1000 Angstrom. The second UBM layer 16 is a copper seed layer formed on the first UBM layer 14 by physical vapor deposition (PVD) or sputtering. The second UBM layer 16 may be formed of copper alloys that include silver, chromium, nickel, tin, gold, and combinations thereof. The second UBM layer 16 is deposited to a thickness of between about 500 and 10000 angstrom, for example, to a thickness of about 5000 Angstrom. In one embodiment, the UBM layer 12 includes a first UBM layer 14 formed of Ti and a second UBM layer 16 formed of Cu.

Next, a mask layer 18 is provided on the UBM layer 12 and patterned with an opening 19 exposing a portion of the UBM layer 12 for Cu pillar bump formation. The mask layer 18 may be a dry film or a photoresist film. The opening 19 is then partially or fully filled with a conductive material with solder wettability. In an embodiment, a copper (Cu) layer 20 is formed in the opening 19 to contact the underlying UBM layer 12. As used throughout this disclosure, the term "copper (Cu) layer" is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu layer 20. In an exemplary embodiment, the thickness of the Cu layer 20 is greater than 25 um. In another exemplary embodiment, the thickness of the Cu layer 20 is greater than 40 um. For example, the Cu layer 20 is of about 40~50 um thickness, about 45 um thickness, or about 40~70 μm thickness, although the thickness may be greater or smaller.

Figure 1B:
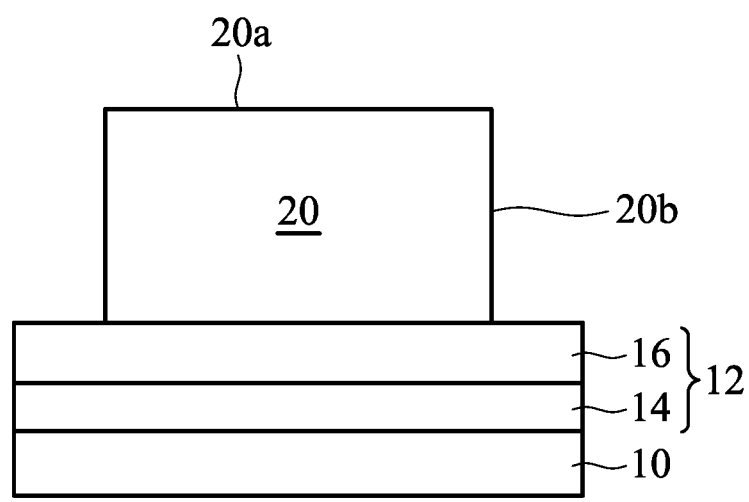

With reference to FIG. 1B, the mask layer 18 is removed, exposing the top surface 20a and sidewall surfaces 20b of the Cu layer 20 and a portion of the UBM layer 12 outside the Cu layer 20. The Cu layer 20 is referred to as a Cu pillar 20 hereinafter. In the case the mask layer 18 is a dry film, it may be removed using an alkaline solution. If the mask layer 18 is formed of photoresist, it may be removed using acetone, n-methyl pyrrolidone (NMP), dimethyl sulfoxide (DMSO), aminoethoxy ethanol, and the like.

Figure 1C:
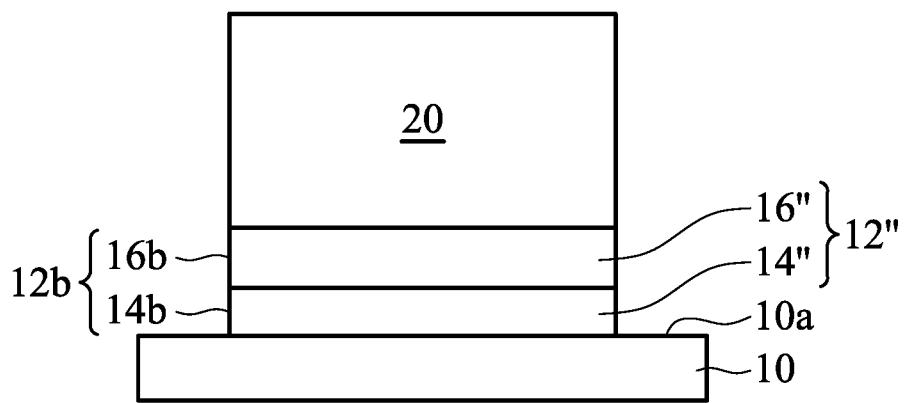

Then as shown in FIG. 1C, using the Cu pillar 20 as a mask, the exposed portion of the UBM layer 12 is etched to expose a surface region 10a of the underlying substrate 10. In an exemplary embodiment, the step of etching the UBM layer 12 is a dry etching or a wet etching. For example, an isotropic wet etching (often referred to as flash etching due to its short duration) using an ammonia-based acid is employed, or a dry etching process, such as standard RIE procedure is employed. Thus, underlying the Cu pillar 20, the patterned UBM layer 12" has exposed sidewall surfaces

12b. In detail, the patterned second UBM layer 16" has sidewall surfaces 16b, and the patterned first UBM layer 14" has sidewall surfaces 14b.

Figure 1D:
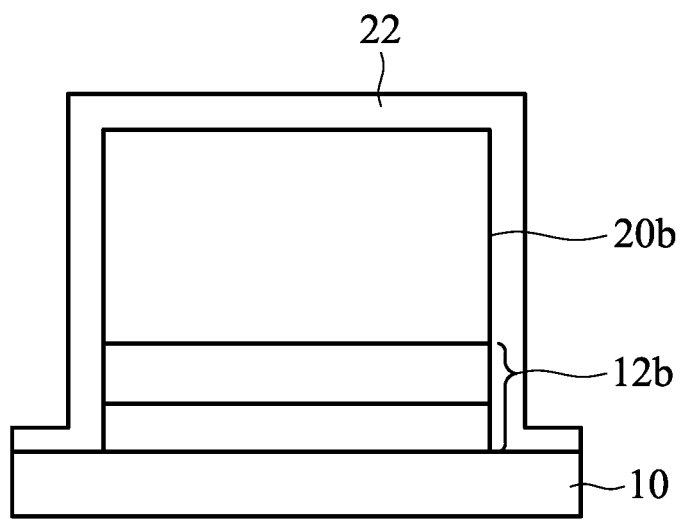

With reference to FIG. 1D, a protection layer 22 is formed on the resulted structure, for example by a blanket deposition. In detail, the protection layer 22 is deposited to cover the top surface 20a and the sidewall surfaces 20b of the Cu pillar 20, the sidewall surfaces 12b of the patterned UBM layer 12". The protection layer 22 is a non-metal material layer, for example a dielectric material layer, a polymer material layer or combinations thereof. The protection layer 22 may be a single material layer, or a multi-layered structure. The protection layer 22 is between about 500 Angstroms to about 10000 Angstroms thick. In one embodiment, the protection layer 22 is a dielectric material layer formed of silicon nitride, silicon oxide, silicon oxynitride, silicon carbide, alternating layers of silicon oxide and silicon nitride, or combinations thereof by using any of a variety of deposition techniques, including thermal oxidation, LPCVD (low-pressure chemical vapor deposition), APCVD (atmospheric-pressure chemical vapor deposition), PECVD (plasma-enhanced chemical vapor deposition) and future-developed deposition procedures. In another embodiment, the protection layer 22 is a polymer material layer, as the name suggests, is formed of a polymer, such as an epoxy, polyimide, benzocyclobutene (BCB), polybenzoxazole (PBO), and the like, although other relatively soft, often organic, dielectric materials can also be used. The polymer material layer is soft, and hence has the function of reducing inherent stresses on respective substrate. In addition, the polymer layer is easily formed to thickness of tens of microns.

Figure 1E:
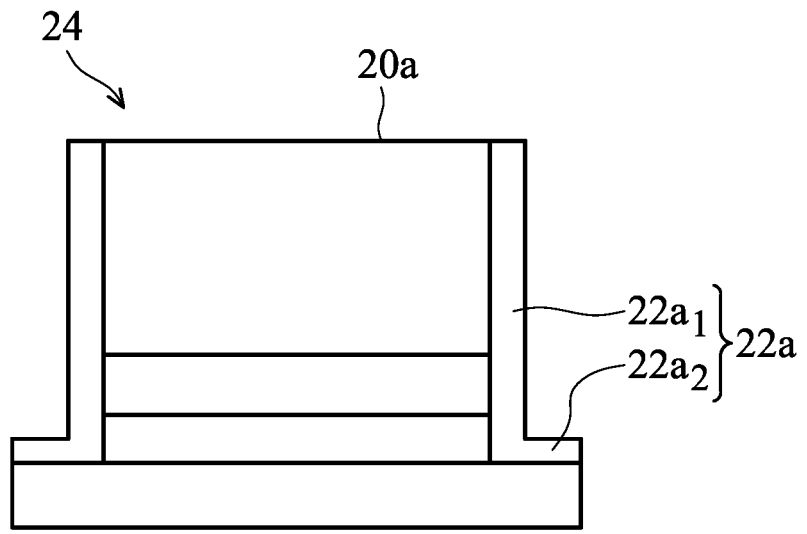

Next, referring to FIG. 1E, a region of the protection layer 22 are removed from the top surface 20a of the Cu pillar 20 through a chemical mechanical polishing (CMP) process, thereby leaving resulting L-shaped sidewall spacers 22a. The L-shaped sidewall spacer 22a lines the sidewall surfaces 20b and 12b and extends to the adjacent surface region 10a of the substrate 10. The L-shaped sidewall spacer 22a includes a first portion 22a$_1$ along sidewall surfaces 20b and 12b, and a second portion 22a$_2$ along the surface region 10a. The upper surfaces of the L-shaped sidewall spacer 22a are substantially coplanar with the top surface 20a of the Cu pillar 20. The L-shaped sidewall spacer 22a is also referred to as a sidewall protection structure 22a hereinafter. Advances in lithography and masking techniques and dry etch processes, such as RIE (Reactive Ion Etching) and other plasma etching processes, allow production of the sidewall protection structure. The completed bump structure 24 includes the Cu pillar 20 and the patterned UBM layer 12". The L-shaped sidewall spacer 22a covers the sidewall surfaces 20b and 12b and the adjacent surface region 10a.

Figure 1F:
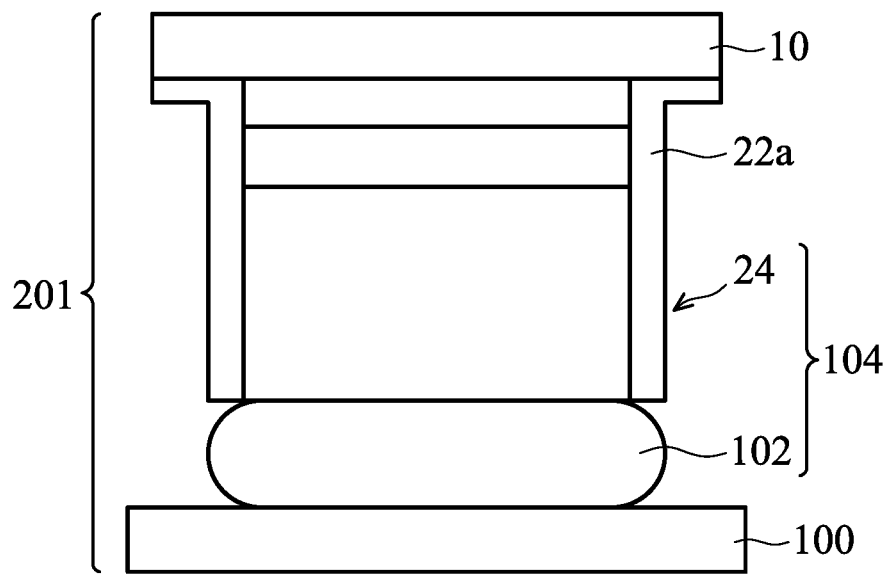

The substrate 10 is then sawed and packaged onto a package substrate, or another die, with solder balls or Cu bumps mounted on a pad on the package substrate or the other die. FIG. 1F is a cross-sectional diagram depicting an exemplary embodiment of a flip-chip assembly. The structure shown in FIG. 1E is flipped upside down and attached to another substrate 100 at the bottom. The substrate 100 may be a package substrate, board (e.g., a printed circuit board (PCB)), or other suitable substrate. The bump structure 24 contacts the substrate 100 at various conductive attachment points, for example, a joint solder layer 102 on contact pads and/or conductive traces, forming a joint structure 104 coupling the two substrates 10 and 100. The joint solder layer 102 may be a eutectic solder material including alloys of tin, lead, silver, copper, nickel, bismuth, or combinations thereof. An exemplary coupling process includes a flux application, chip placement, reflowing of melting solder joints, and cleaning of flux residue. The integrated circuit substrate 10, the joint structure 104, and the other substrate 100 may be referred to as a packaging assembly 201, or in the present embodiment, a flip-chip packaging assembly.

The disclosure provides an L-shaped sidewall protection structure formed of a non-metal material on the Cu pillar sidewall to prevent the Cu pillar sidewall from oxidation and increase adhesion between the Cu pillar sidewall and a subsequently formed underfill material. Compared with the conventional immersion Sn method followed by an annealing process, the non-metal sidewall protection structure can adjust substrate stress, prevent solder wetting to the Cu pillar around the perimeter of the UBM layer during the reflow process, and eliminate blue tape residue. This is applicable to fine pitch bump schemes.

FIGS. 2A~2E are cross-sectional views depicting another exemplary embodiment of a portion of a semiconductor device at stages in a Cu pillar bump process, while explanation of the same or similar portions to the description in FIGS. 1A to 1F will be omitted.

Figure 2A:
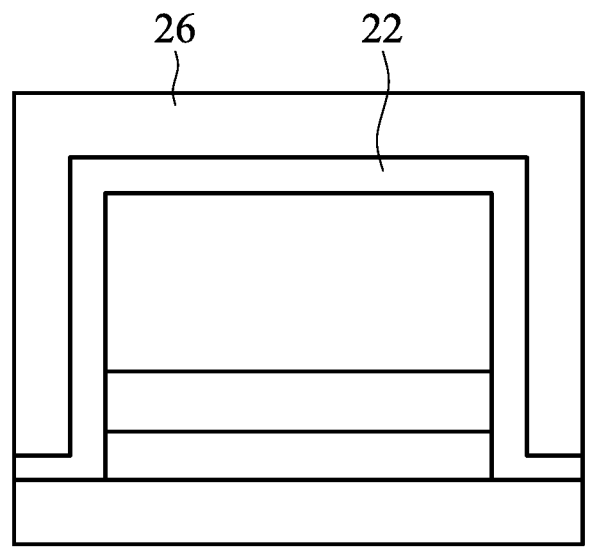
FIGS. 2A~2E are cross-sectional views depicting an exemplary embodiment of a portion of a semiconductor device at stages in a Cu pillar bump process.
Figure 2B:
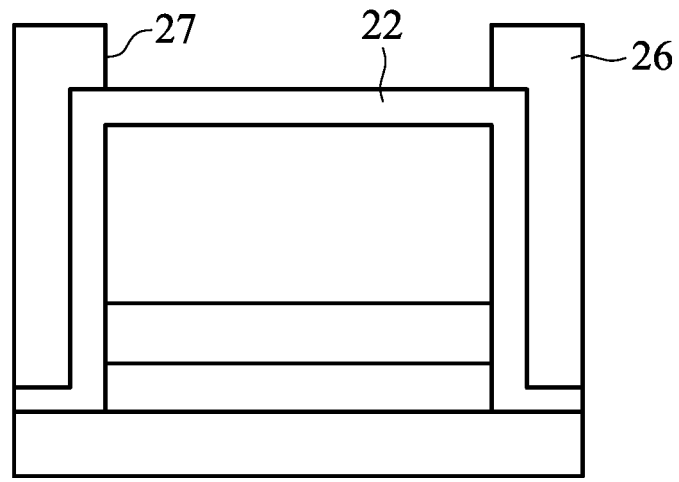
Figure 2C:
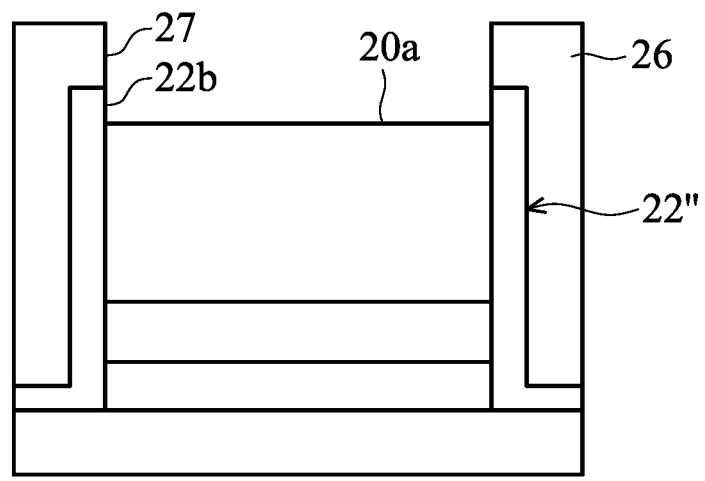

With reference to FIG. 2A, after depositing the protection layer 22 on the Cu pillar 20, the patterned UBM layer 12" and the adjacent surface region 10a of the substrate 10, a photoresist layer 26 is coated on the protection layer 22. Then as depicted in FIG. 2B, the photoresist layer 26 is patterned by laser exposure, bake, developing, and/or other photolithography processes known in the art to provide an opening 27 exposing a portion of the protection layer 22 positioned over the top surface 20a of the Cu pillar 20. The exposed portion of the protection layer 22 is then etched, by a wet etch or dry etch process, using the patterned photoresist layer as a masking element to provide an opening 22b in the protection layer 22, thereby exposing the top surface 20a of the Cu pillar 20 as depicted in FIG. 2C.

Figure 2D:
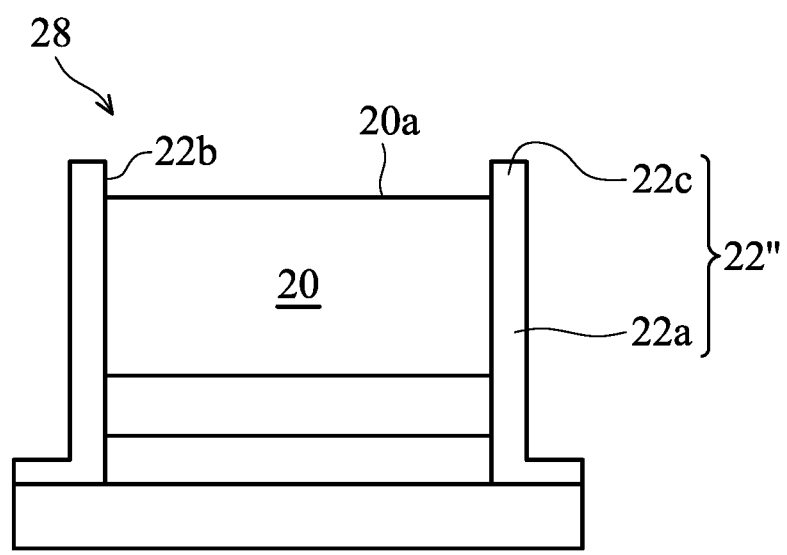

With reference to FIG. 2D, the photoresist layer 26 is removed, leaving resulting an elongated sidewall protection structure 22" that includes the L-shaped sidewall spacer 22a and a protrusion 22c extending from the upper surface of the L-shaped sidewall spacer 22a. That is, elongated sidewall protection structure 22" has an upper surface higher than the top surface 20a of the Cu pillar 20. The completed bump structure 28 includes the Cu pillar 20 and the patterned UBM layer 12". The elongated sidewall protection structure 22" covers the sidewall surfaces 20b and 12b and the surface region 10a.

Figure 2E:
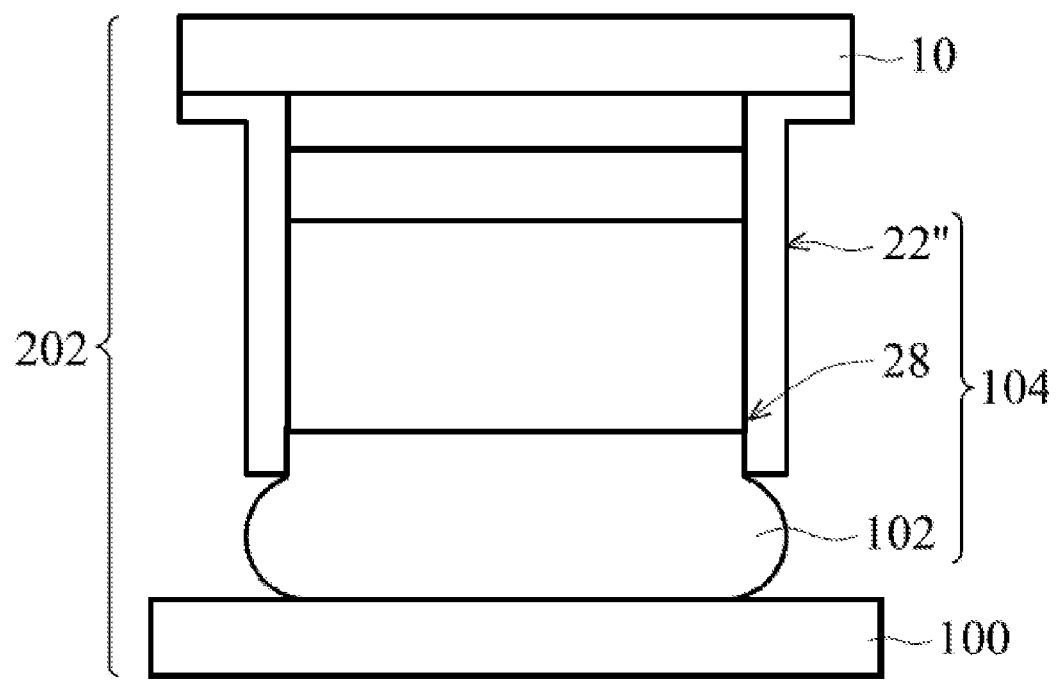

Referring to FIG. 2E, the substrate 10 is flipped upside down and attached to another substrate 100 at the bottom. The bump structure 28 contacts the substrate 100 at various conductive attachment points, for example, a joint solder layer 102 on contact pads and/or conductive traces, forming a joint structure 104 coupling the two substrates 10 and 100. The integrated circuit substrate 10, the joint structure 104, and the other substrate 100 may be referred to as a packaging assembly 202, or in the present embodiment, a flip-chip packaging assembly.

FIGS. 3A~3G are cross-sectional views depicting another exemplary embodiment of a portion of a semiconductor device at stages in a Cu pillar bump process, while explanation of the same or similar portions to the description in FIGS. 1A to 1F will be omitted.

Figure 3A:
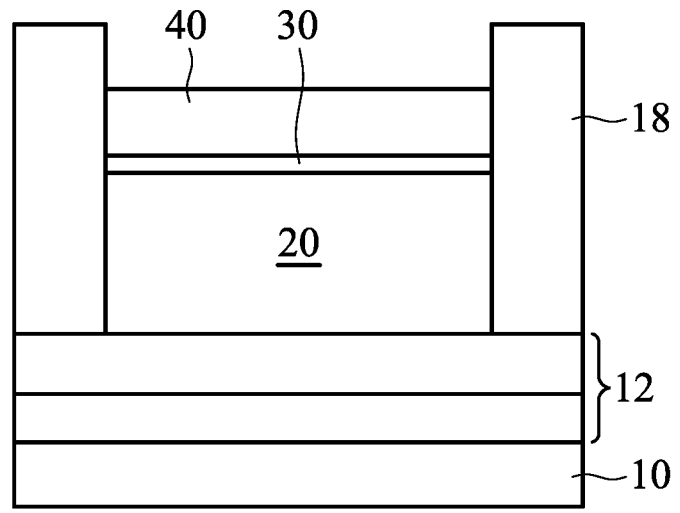
FIGS. 3A~3G are cross-sectional views depicting an exemplary embodiment of a portion of a semiconductor device at stages in a Cu pillar bump process.

With reference to FIG. 3A, after forming the Cu layer 20 in the opening 19 of the mask layer 18, a cap layer 30 is formed on the top surface 20a of the Cu layer 20. The cap layer 30 could act as a barrier layer to prevent copper in the Cu pillar from diffusing into bonding material, such as solder alloy, that is used to bond the substrate 10 to external features. The prevention of copper diffusion increases the reliability and bonding strength of the package. The cap layer 30 may include nickel (Ni), tin, tin-lead (SnPb), gold (Au), silver, palladium (Pd), In, nickel-palladium-gold (NiPdAu), nickel-gold (NiAu), other similar materials, or alloy by plating methods. The cap layer 30 has a thickness about 1~10 um. In some embodiments, the cap layer 30 is a multi-layers structure including Ni, Au, Pd, Ni-base alloy, Au-base alloy, or Pd-base alloy.

Then a solder layer 40 is formed on the cap layer 30. The solder layer 40 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by plating processes. In one embodiment, the solder layer 40 is a lead-free solder layer. For a lead-free solder system, the solder layer is SnAg with Ag content being controlled lower than 3.0 weight percent (wt %). For example, the lead-free solder layer is SnAg with Ag content being controlled at about 2.5 weight percent (wt %).

Figure 3B:
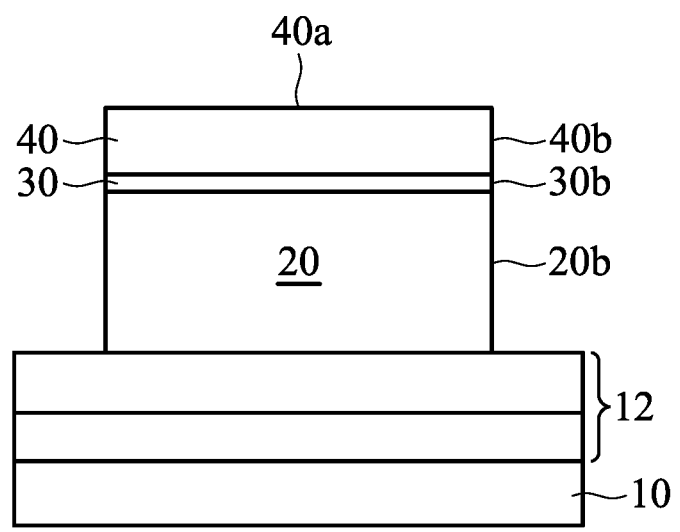
Figure 3C:
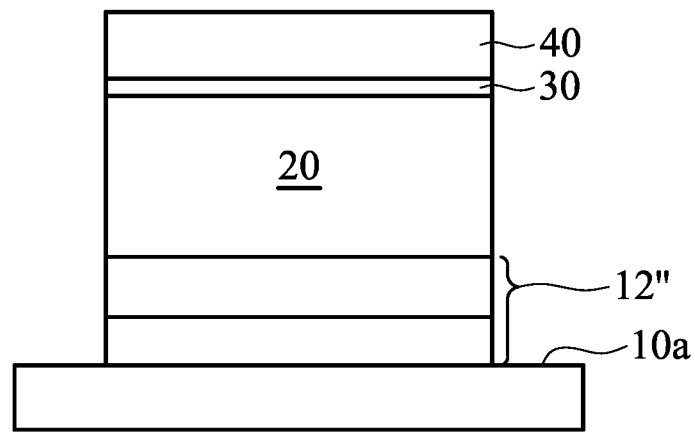
Figure 3D:
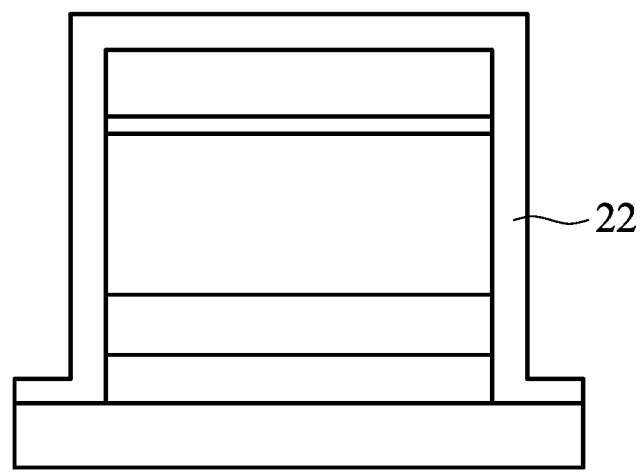
Figure 3E:
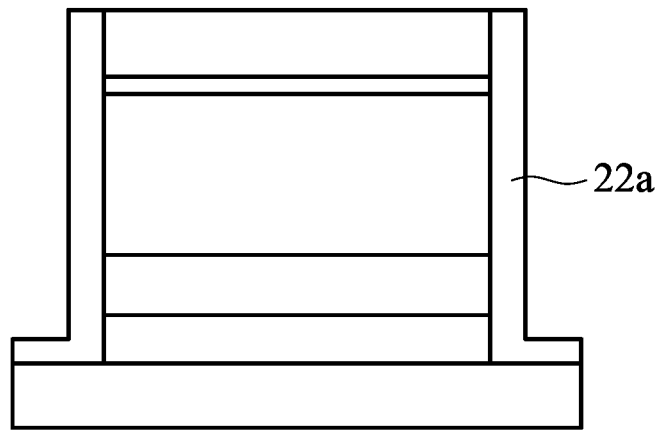

Next, as shown in FIG. 3B, the mask layer 18 is removed, and the top surface 40a and sidewall surfaces 40b of the solder layer and the sidewall surfaces 30b of the cap layer 30 are exposed. Then the exposed portion of the UBM layer 12 is etched as shown in FIG. 3C, exposing the underlying surface region 10a outside the Cu pillar 20. Thereafter, as depicted in FIG. 3D, a protection layer 22 is formed to cover the resulted structure. After performing a CMP process, an L-shaped sidewall spacer 22a is created as depicted in FIG. 3E. The top surface 40a of the solder layer 40 is therefore exposed. The upper surfaces of the L-shaped sidewall spacer 22a are substantially coplanar with the top surface 40a of the solder layer 40.

Figure 3F:
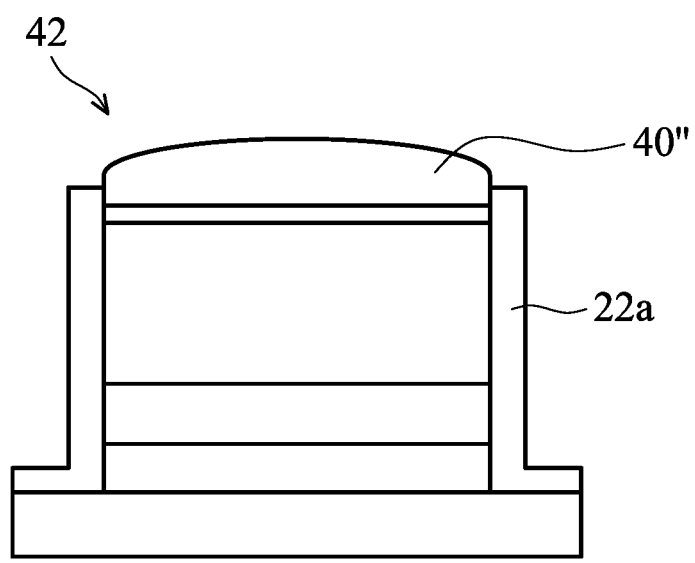

With reference to FIG. 3F, a reflowing process is performed on the solder layer 40 to form a reflowed solder layer 40" on the cap layer 30. This completes a bump structure 42 that includes the Cu pillar 20, the cap layer 30 on the Cu pillar 20, the reflowed solder layer 40" on the cap layer 30 and the patterned UBM layer 12" underlying the Cu pillar 20. The L-shaped sidewall spacer 22a covers the sidewall surfaces 40b, 30b, 20b and 12b and the surface region 10a.

Figure 3G:
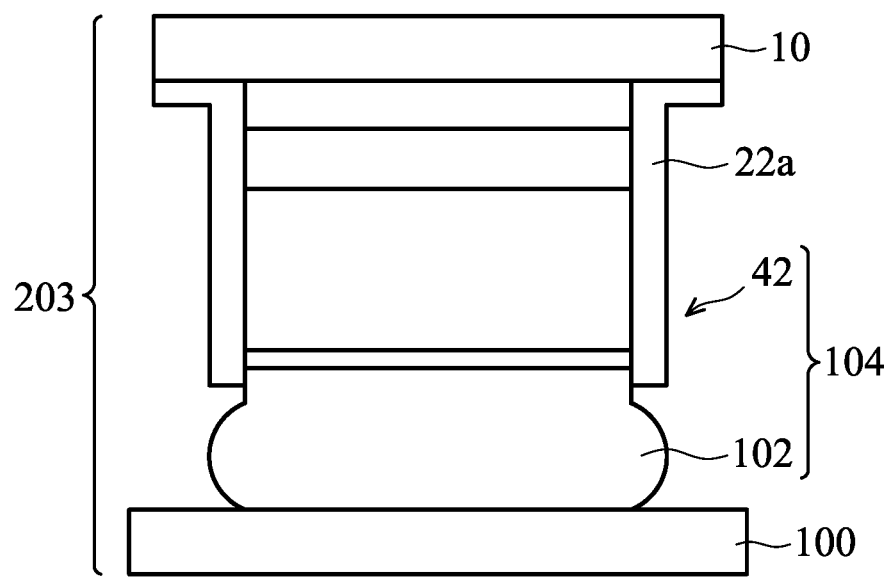

The substrate 10 is then sawed and packaged onto a package substrate, or another die, with solder balls or Cu bumps mounted on a pad on the package substrate or the other die. Referring to FIG. 3G, the substrate 10 is flipped upside down and attached to another substrate 100 at the bottom. The bump structure 42 contacts the substrate 100 at various conductive attachment points, for example, a joint solder layer 102 on contact pads and/or conductive traces, forming a joint structure 104 coupling the two substrates 10 and 100. The integrated circuit substrate 10, the joint structure 104, and the other substrate 100 may be referred to as a packaging assembly 203, or in the present embodiment, a flip-chip packaging assembly.

FIGS. 4A~4E are cross-sectional views depicting another exemplary embodiment of a portion of a semiconductor device at stages in a Cu pillar bump process, while explanation of the same or similar portions to the description in FIGS. 3A to 3G will be omitted.

Figure 4A:
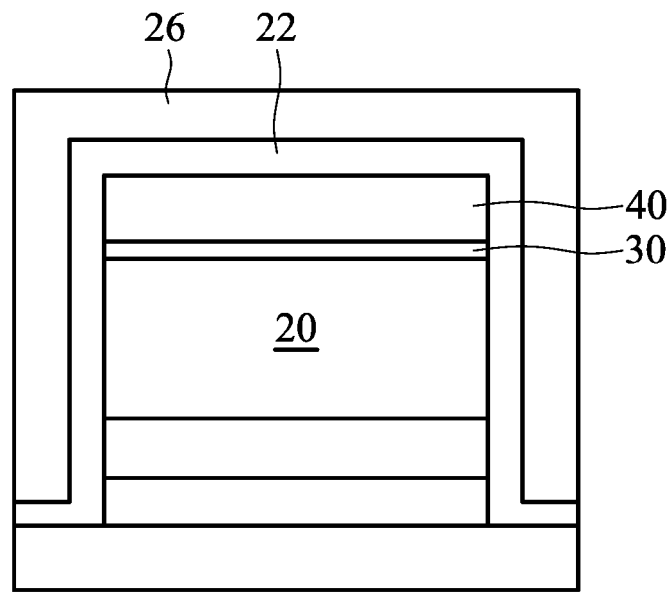
FIGS. 4A~4E are cross-sectional views depicting an exemplary embodiment of a portion of a semiconductor device at stages in a Cu pillar bump process.
Figure 4B:
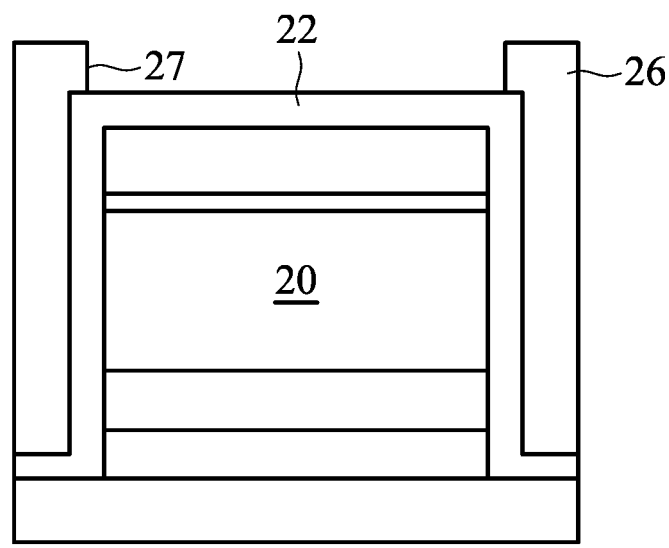
Figure 4C:
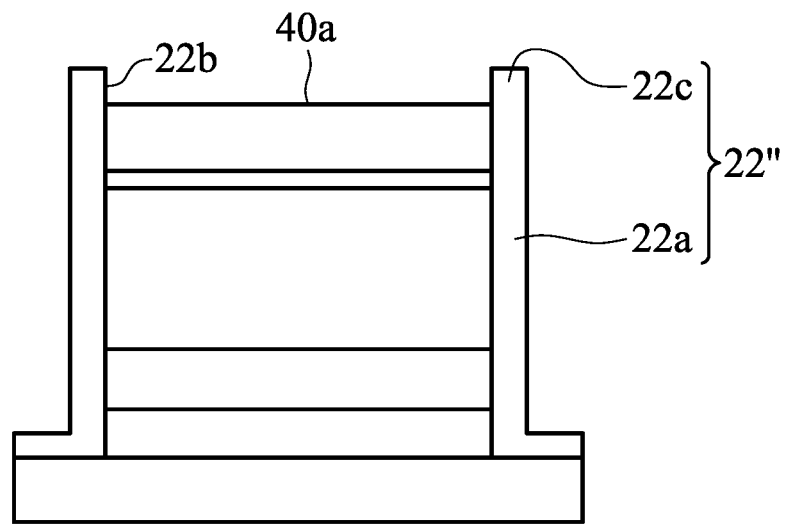

With reference to FIG. 4A, after depositing the protection layer 22 on the resulted structure, a photoresist layer 26 is coated on the protection layer 22. Then as depicted in FIG. 4B, the photoresist layer 26 is patterned by laser exposure, bake, developing, and/or other photolithography processes known in the art to provide an opening 27 exposing a portion of the protection layer 22 positioned over the top surface 40a of the solder layer 40. The exposed portion of the protection layer 22 is then etched, by a wet etch or dry etch process, using the patterned photoresist layer as a masking element to provide an opening 22b in the protection layer 22, thereby exposing the top surface 40a of the solder layer 40, as depicted in FIG. 4C. The photoresist layer 26 is then removed, resulting an elongated sidewall protection structure 22" that includes the L-shaped sidewall spacer 22a and a protrusion 22c extending from the upper surface of the L-shaped sidewall spacer 22a. That is, elongated sidewall protection structure 22" has an upper surface higher than the top surface 40a of the solder layer 40.

Figure 4D:
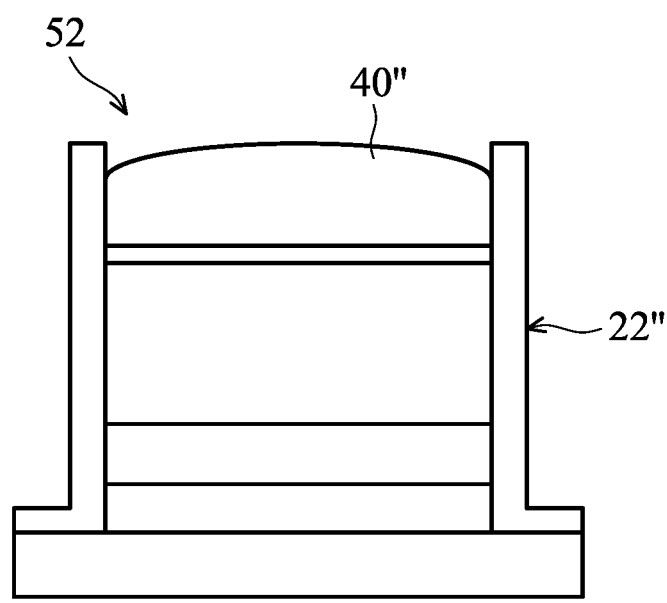

With reference to FIG. 4D, a reflowing process is performed on the solder layer 40 to form a reflowed solder layer 40" on the cap layer 30. This completes a bump structure 52 that includes the Cu pillar 20, the cap layer 30 on the Cu pillar 20, the reflowed solder layer 40" on the cap layer 30, and the patterned UBM layer 12" underlying the Cu pillar 20. The elongated L-shaped sidewall spacer 22" covers the sidewall surfaces 40b, 30b, 20b and 12b and the surface region 10a. The upper surface of the elongated sidewall protection structure 22" is greater than not only the top surface 20a of the Cu pillar 20, but also the top surface 30a of the cap layer 30. The upper surface of the elongated sidewall protection structure 22" may be equal to or higher than the top surface 40a of the solder layer 40 depending on the volume of the solder layer 40 and the reflow process control.

Figure 4E:
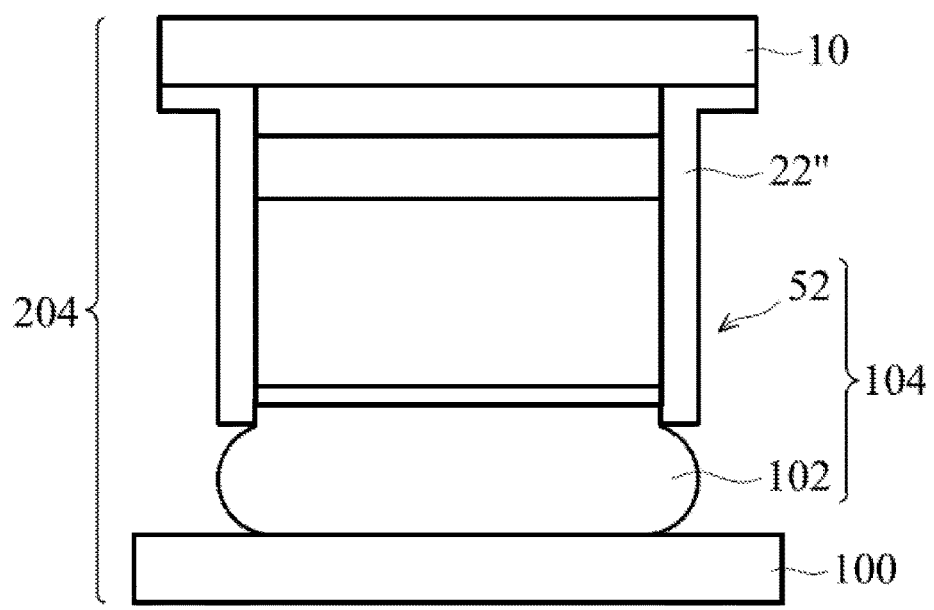

Referring to FIG. 4E, the substrate 10 is flipped upside down and attached to another substrate 100 at the bottom. The bump structure 58 contacts the substrate 100 at various conductive attachment points, for example, a joint solder layer 102 on contact pads and/or conductive traces, forming a joint structure 104 coupling the two substrates 10 and 100. The integrated circuit substrate 10, the joint structure 104, and the other substrate 100 may be referred to as a packaging assembly 204, or in the present embodiment, a flip-chip packaging assembly.

One aspect of this description relates to a method of forming an integrated circuit device. The method includes forming a bump structure on a substrate, wherein the bump structure has a top surface and a sidewall surface, and the substrate has a surface region exposed by the bump structure. The method further includes depositing a non-metal protection layer on the top surface and the sidewall surface of the bump structure and the surface region of the substrate. The method further includes removing the non-metal protection layer from the top surface of the bump structure, wherein a remaining portion of the non-metal protection layer forms an L-shaped protection structure, and a top surface of the remaining portion of the non-metal protection layer is farther from the substrate than a top surface of the bump structure.

Another aspect of this description relates to a method of forming an integrated circuit. The method includes forming a copper layer over a substrate; and depositing a non-metal protective layer over a top surface of the copper layer and along sidewalls of the copper layer. The method further includes removing a portion of the non-metal protective layer over the top surface of the copper layer, wherein a top surface of the non-metal protective layer after removing the portion of the non-metal protective layer is above the top surface of the copper layer. The method further includes plating a cap layer over the top surface of the copper layer; and plating a solder layer over the cap layer.

Still another aspect of this description relates to a method of forming an integrated circuit. The method includes depositing an under bump metallurgy (UBM) layer over a substrate. The method further includes plating a copper layer over the UBM layer; and depositing a non-metal protective layer over a top surface of the copper layer, along sidewalls of the copper layer, and along sidewalls of the UBM layer. The method further includes removing a portion of the non-metal protective layer over the top surface of the copper layer, wherein a top surface of the non-metal protective layer after removing the portion of the non-metal protective layer is above the top surface of the copper layer.

In the preceding detailed description, the disclosure is described with reference to specific exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. A method of forming an integrated circuit device, the method comprising:
    forming a bump structure on a substrate, wherein the bump structure has a top surface and a sidewall surface, and the substrate has a surface region exposed by the bump structure;
    depositing a non-metal protection layer on the top surface and the sidewall surface of the bump structure and the surface region of the substrate;
    removing the non-metal protection layer from the top surface of the bump structure, wherein a remaining portion of the non-metal protection layer forms an L-shaped protection structure, and a top surface of the remaining portion of the non-metal protection layer is farther from the substrate than a top surface of the bump structure; and
    bonding the bump structure to another die using a solder layer.

2. The method of claim 1, wherein removing the non-metal protection layer comprises performing an etching process to expose the top surface of the bump structure.

3. The method of claim 2, further comprising depositing a cap layer over the bump structure.

4. The method of claim 1, wherein removing the non-metal protection layer comprises:
    forming a photoresist layer on the non-metal protection layer;
    forming a first opening in the photoresist layer;
    forming a second opening in the non-metal protection layer positioned corresponding to the first opening, thereby exposing the top surface of the bump structure; and
    removing the photoresist layer.

5. The method of claim 1, wherein depositing the non-metal protection layer comprises depositing a silicon nitride layer, a polyimide layer, or combinations thereof.

6. The method of claim 1, wherein the forming of the bump structure comprises forming a conductive bump structure.

7. A method of forming an integrated circuit, the method comprising:
    forming a copper layer over a substrate;
    depositing a non-metal protective layer over a top surface of the copper layer and along sidewalls of the copper layer;
    removing a portion of the non-metal protective layer over the top surface of the copper layer, wherein a top surface of the non-metal protective layer after removing the portion of the non-metal protective layer is above the top surface of the copper layer;
    plating a cap layer over the top surface of the copper layer; and
    plating a solder layer over the cap layer.

8. The method of claim 7, wherein removing the portion of the non-metal protective layer comprises planarizing the non-metal protective layer or etching the non-metal protective layer.

9. The method of claim 7, wherein the depositing of the non-metal protective layer comprises depositing the non-metal protective layer on a surface region of the substrate exposed by the copper layer.

10. The method of claim 7, wherein plating the cap layer is prior to depositing the non-metal protective layer.

11. The method of claim 7, wherein plating the cap layer occurs after depositing the non-metal protective layer.

12. The method of claim 7, wherein plating the solder layer occurs after depositing the non-metal protective layer.

13. The method of claim 7, further comprising depositing an under bump metallurgy (UBM) layer between the copper layer and the substrate, wherein the depositing of the non-metal protective layer comprises depositing the non-metal protective layer over sidewalls of the UBM layer.

14. A method of forming an integrated circuit, the method comprising:
    depositing an under bump metallurgy (UBM) layer over a substrate;
    plating a copper layer over the UBM layer;
    depositing a non-metal protective layer over a top surface of the copper layer, along sidewalls of the copper layer, and along sidewalls of the UBM layer; and
    removing a portion of the non-metal protective layer over the top surface of the copper layer, wherein a top surface of the non-metal protective layer after removing the portion of the non-metal protective layer is above the top surface of the copper layer.

15. The method of claim 14, wherein removing the portion of the non-metal protective layer comprises a planarization process.

16. The method of claim 14, wherein removing the portion of the non-metal protective layer comprises an etching process.

17. The method of claim 14, further comprising plating a solder layer over the copper layer.

18. The method of claim 17, wherein plating the solder layer comprises plating the solder layer prior to depositing the non-metal protective layer.

19. The method of claim 17, wherein depositing the non-metal protective layer comprises depositing the non-metal protective layer prior to plating the solder layer.

20. The method of claim 17, further comprising bonding the copper layer to a die using the solder layer.

* * * * *